United States Patent [19]
Gotoh

[11] Patent Number: 5,942,923
[45] Date of Patent: Aug. 24, 1999

[54] LOW-VOLTAGE OUTPUT DRIVING CIRCUIT HAVING PULL-UP TRANSISTOR WITH COMPARATOR CONTROLLED GATE

[75] Inventor: Kimiko Gotoh, Oita, Japan

[73] Assignee: Texas Instruments Incorporated, Dallas, Tex.

[21] Appl. No.: 08/261,613

[22] Filed: Jun. 17, 1994

[30] Foreign Application Priority Data

Jun. 18, 1993 [JP] Japan ................................ 5-147297

[51] Int. Cl.$^6$ ........................... H03K 3/00; H03K 5/08
[52] U.S. Cl. ..................... 327/112; 327/312; 327/313; 327/321; 327/544
[58] Field of Search .................... 327/108, 109, 327/110, 111, 112, 309, 544, 310, 312, 313, 315, 318, 321, 322, 327, 328, 331, 434

[56] References Cited

U.S. PATENT DOCUMENTS

| | | | |
|---|---|---|---|
| 4,070,600 | 1/1978 | Butler et al. ................... | 315/169 R |
| 4,074,148 | 2/1978 | Sato ............................. | 307/279 |
| 4,256,974 | 3/1981 | Padgett et al. ................. | 307/475 |
| 4,424,456 | 1/1984 | Shiraki et al. ................. | 307/268 |
| 4,604,535 | 8/1986 | Sasayama et al. ............... | 307/570 |
| 4,857,863 | 8/1989 | Ganger et al. .................. | 330/264 |
| 4,884,165 | 11/1989 | Kong et al. .................... | 361/98 |
| 4,965,464 | 10/1990 | Von Basse et al. ............... | 307/270 |
| 5,117,129 | 5/1992 | Hoffman et al. ................. | 307/443 |
| 5,180,936 | 1/1993 | McDonald ....................... | 327/382 |
| 5,276,364 | 1/1994 | Wellheuser ..................... | 326/64 |
| 5,280,200 | 1/1994 | Tarng .......................... | 327/312 |
| 5,281,862 | 1/1994 | Ma ............................. | 307/270 |

Primary Examiner—Kenneth B. Wells
Attorney, Agent, or Firm—William B. Kempler; Richard L. Donaldson

[57] ABSTRACT

A low-voltage output driving circuit capable of preventing the generation of leakage current. The circuit includes a transfer gate GT installed between the output $S_2$ of a first CMOS inverter $INV_{C1}$ and the node $S_1$ at the gate of an MOS transistor $PT_3$ for active pull-up. At the same time, a reference voltage $V_{REF}$ and a voltage level $V_{OUT}$, which corresponds to the voltage level of the output line of the signal $S_{OUT}$, are compared by a comparator CMP. When the voltage $V_{OUT}$ is lower than the reference voltage $V_{REF}$, the transfer gate GT is set to the ON state, and the output of the first CMOS inverter $INV_{C1}$ is sent to the gate of the transistor $PT_3$ for active pull-up. The comparator CMP is installed so that when the voltage level $V_{OUT}$ is higher than the reference voltage $V_{REF}$, the output of the first CMOS inverter $INV_{C1}$ is prevented from reaching the gate of the transistor $PT_3$ for active pull-up. Thus, although the input and output can take on any state, the generation of leakage current which flows toward the power supply from the output side can be prevented.

9 Claims, 2 Drawing Sheets

5,942,923

LOW-VOLTAGE OUTPUT DRIVING CIRCUIT HAVING PULL-UP TRANSISTOR WITH COMPARATOR CONTROLLED GATE

This invention pertains to a low-voltage output driving circuit to be applied as an interface to a mixed voltage system.

BACKGROUND OF THE INVENTION

Recently, the demands of higher speed and lower power consumption for digital electronic circuits to be adopted in a broad field have increased. A circuit which can meet such demands to some degree has recently been realized by a BiCMOS integrated circuit in which bipolar technology and CMOS technology are combined.

Also, a further large reduction in power consumption has been realized by a low-voltage technology, and thus, a 3.3 V power supply could be used instead of a 5 V power supply.

For this reason, for example, the realization of a low voltage output driving circuit which can be applied to a mixed voltage system containing equipment having respective power supplies of 5 V and 3.3 V is required, and some low-voltage output driving circuits are suggested for this purpose.

FIG. 5 is a circuit diagram of a conventional low-voltage output driving circuit which adopts this low-voltage technology.

In FIG. 5, 1 is a logic device. $V_{CC}$ represents a 3.3 V power supply voltage, for instance. $Q_1$–$Q_3$ are npn bipolar transistors. $NT_1$–$NT_3$ are n channel MOS transistors (hereinafter, referred to as NMOS transistors). $PT_1$–$PT_3$ are p channel MOS transistors (hereinafter, referred to as PMOS transistors). $D_1$ is a diode.

Also, the diode $D_1$ can be a Schottky diode, for instance.

The input signal $S_{IN}$ and the control signal $C_{IN}$ are input to the logic device 1. In the logic device 1, three output levels are controlled by the control signal $C_{IN}$. When this low-voltage output driving circuit functions as an ordinary buffer, the input level of the signal $S_{IN}$ is output as is. When the outputs of the low-voltage output driving circuit functions are in three state modes, which includes a high impedance state, the first and second outputs are set to a low level, and the third output is set to a high level.

The base of the bipolar transistor $Q_1$ is connected to the first output of the logic device 1, and the collector of the transistor $Q_1$ is connected to the cathode of the diode $D_1$ and the collector of the bipolar transistor $Q_2$, and the emitter of the transistor $Q_1$ is connected to the base of the bipolar transistor $Q_2$. The anode of the diode $D_1$ is connected to the power supply voltage $V_{CC}$.

The emitter of the bipolar transistor $Q_2$ is connected to the drain of the PMOS transistor $PT_3$ and the NMOS transistor $NT_3$ and to the collector of the bipolar transistor $Q_3$. At the same time, the emitter of the transistor $Q_2$ is connected to the output line of the output signal $S_{OUT}$.

The drains and also the gates of the PMOS transistor $PT_1$ and the NMOS transistor $NT_1$ are connected together. At the same time, the source of the PMOS transistor $PT_1$ is connected to the power supply voltage $V_{CC}$, and the source of the NMOS transistor $NT_1$ is grounded. Thus, the first CMOS invertor $INV_{C1}$ is constituted.

The input to the first CMOS invertor $INV_{C1}$, namely, the point of connection of the gates of the PMOS transistor $PT_1$ and the NMOS transistor $NT_1$ is connected to the second output of the logic device 1, and the output, namely, the point of connection of the drains of both transistors, is connected to the gate of the PMOS transistor $PT_3$.

The drains and also the gates of the PMOS transistor $PT_2$ and the NMOS transistor $NT_2$ are connected together. At the same time, the source of the PMOS transistor $PT_2$ is connected to the power supply voltage $V_{CC}$, and the source of the NMOS transistor $NT_2$ is grounded. Thus, the second CMOS invertor $INV_{C2}$ is constituted.

The input of the second CMOS invertor $INV_{C2}$, namely, the point of connection of the gates of the PMOS transistor $PT_2$ and the NMOS transistor $NT_2$ is connected to the third output of the logic device 1, and the output, namely, the point of connection of the drains of both transistors is connected to the base of the bipolar transistor $Q_3$ and the gate of the NMOS transistor $NT_3$.

Also, the base of the bipolar transistor $Q_3$ and the source of the NMOS transistor $NT_3$ are grounded.

In this constitution, when the input signal $S_{IN}$ is input at a high level, since the bipolar transistor $Q_1$ turns ON, the bipolar transistor $Q_2$ turns ON.

Also, the output of the first CMOS invertor $INV_{C1}$ goes low, and is supplied to the gate of the PMOS transistor $PT_3$ for active pull-up. Thus, the PMOS transistor $PT_3$ turns ON.

The output of the second CMOS invertor goes low, and is provided to the base of the bipolar transistor $Q_3$ and the gate of the NMOS transistor $NT_3$. Thus, the bipolar transistor $Q_3$ and the NMOS transistor $NT_3$ are maintained at the ON state.

The emitter voltage of the bipolar transistor $Q_2$ is maintained two base-emitter voltage drops below the power supply voltage $V_{CC}$ because of the bipolar transistors $Q_1$ and $Q_2$. However, since the emitter of the bipolar transistor $Q_2$ is connected to the drain of the p-channel MOS transistor $PT_3$, the output signal $S_{OUT}$ is maintained to almost the power supply voltage $V_{CC}$ level, and is output.

On the other hand, when the input signal $S_{IN}$ is input at a low level, the bipolar transistors $Q_1$ and $Q_2$ are kept in the OFF state, the output of the first CMOS invertor $INV_{C1}$ goes high, and the PMOS transistor $PT_3$ is kept in the OFF state.

The output of the second CMOS invertor $INV_{C2}$ goes high, and is supplied to the base of the bipolar transistor $Q_3$ and the gate of the NMOS transistor $NT_3$. Thus, the bipolar transistor $Q_3$ and the NMOS transistor $NT_3$ are maintained in the ON state.

As both the transistor $Q_3$ and the $NT_3$ are ON, the output signal $S_{OUT}$ is maintained at a ground level, and is output.

Also, at a time of three state logic, the first and second outputs of the logic device 1 are set to a low level, and are supplied to the base of the bipolar transistor $Q_1$ and the input of the first CMOS invertor $INV_{C1}$.

Thus, the bipolar transistors $Q_1$ and $Q_2$ are maintained in the OFF state, and since the output of the first CMOS invertor $INV_{C1}$ goes high and is supplied to the gate of the PMOS transistor $PT_3$, the PMOS transistor $PT_3$ is also maintained in the OFF state.

On the other hand, the third output of the logic device 1 is set to a high level and is supplied to the input of the second CMOS invertor $INV_{C2}$.

Thus, the output of the second CMOS invertor $INV_{C2}$ goes low, and since it is supplied to the base of the bipolar transistor $Q_3$ and the gate of the NMOS transistor $NT_3$, the bipolar transistor $Q_3$ and the NMOS transistor $NT_3$ are maintained in the OFF state.

Therefore, the output line of the signal $S_{OUT}$ is maintained at the high impedance state.

As mentioned previously, since the circuit of FIG. 5 has the PMOS transistor $PT_3$ for active pull-up, the level is too low at the time of high output, and cannot be regarded as a true high level at all. Also, the output corresponding to three states can be stably obtained.

However, in the above-mentioned conventional circuit, the output potential exceeds the power supply voltage $V_{CC}$ (3.3 V) by a composite voltage signal to be connected. For example, when it is 5 V, regardless of whether the gate level of the PMOS transistor $PT_3$ for active pull-up is high ($V_{CC}$) or low, the PMOS transistor $PT_3$ is ON, and current flows from the output side to the power supply via the PMOS transistor $PT_3$. In other words, there is the problem of leakage current.

It is therefore an object of this invention to provide a low-voltage output driving circuit capable of preventing the occurrence of leakage current.

SUMMARY OF THE INVENTION

The low-voltage output driving circuit of the invention includes an input/output buffer, a transistor for pulling up the output to the power supply voltage level in accordance with the signal to be input to a control terminal, a control circuit, a gate circuit connected between the control circuit and the control terminal of the above-mentioned transistor for the buffer, a clamping transistor which maintains the control terminal of the above-mentioned transistor for the buffer at the above-mentioned output level when the output level is higher than the power supply voltage level, and a gate control circuit which makes the gate circuit conductive when the above-mentioned output level is lower than the power supply voltage level and which makes the gate circuit nonconductive when the above-mentioned output level is higher than the power supply voltage level.

In the second low-power output driving circuit of this invention, at steady state operation, the voltage of the high level output of a buffer is at a level which is approximately equal to or lower than the power supply voltage. Therefore, a gate circuit is maintained to be conductive by a gate control circuit.

In this state, in case a buffer outputs a high-level signal, a transistor for active pull-up goes ON, and the output of the buffer is pulled up to the power supply voltage level.

Here, when the output level of the buffer is higher than the power supply voltage, a gate circuit is maintained to be nonconductive by a gate control circuit. Thus, the transfer of the output signal of a gate control circuit to the control terminal of a transistor for active pull-up is stopped.

At that time, since the output level of a buffer is higher than the power supply voltage, the level of the control terminal of a transistor for active pull-up is maintained at the output level of the buffer.

Therefore, the voltage level equivalent to the output level of the buffer is supplied to the control terminal of the transistor for active pull-up. For this reason, although the output level of the buffer is higher than that of the power supply voltage, the transistor for active pull-up maintains the OFF state stably.

As a result, the inflow of a leakage current from the output side of a buffer to the voltage source via the transistor for active pull-up is impeded.

Also, in case the output of a buffer is in the high impedance state, a transistor for active pull-up is maintained in the OFF state.

Here, when the output level of the buffer is higher than the power supply voltage, a gate circuit is maintained in the nonconducting state by a gate control circuit. Thus, the transfer of the output signal of a gate control circuit to the control terminal of a transistor for active pull-up is prevented.

At that time, since the output level of the buffer is higher than the power supply voltage, the level of the control terminal of a transistor for active pull-up is maintained at the output level of the buffer.

Therefore, the voltage level approximately equal to the output level of the buffer is supplied to the control terminal of a transistor for active pull-up. For this reason, although the output level of the buffer is higher than the power supply voltage, a transistor for active pull-up maintains the OFF state stably.

As a result, the inflow of a leakage current from the output side of the buffer to the voltage source via a transistor for active pull-up is impeded.

Figure 1:
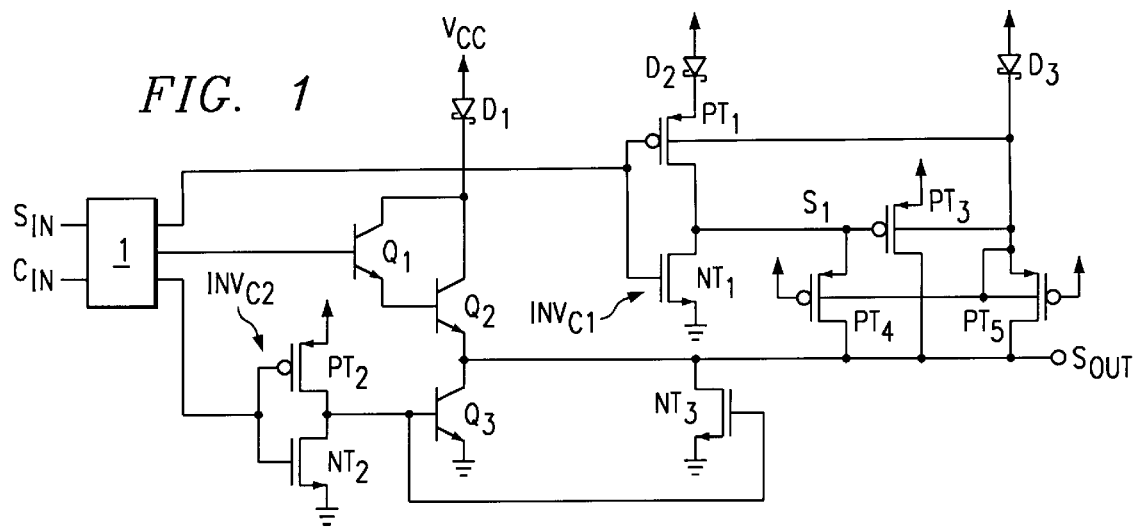
FIG. 1 is a circuit diagram of a first embodiment of a low-voltage output driving circuit in accordance with the invention.

Reference numerals and symbols as shown in the drawings:

| | |
|---|---|
| 1 | Logic device |
| $V_{CC}$ | Power supply voltage |
| $Q_1$–$Q_3$ | npn type bipolar transistor |
| $NT_1$–$NT_8$ | NMOS transistors |
| $PT_1$–$PT_{11}$ | PMOS transistors |
| $D_1$–$D_3$ | Diodes |
| GT | Transfer gate |
| CMP | Comparator |
| $INV_{C1}$ | First CMOS inverter |
| $INV_{C2}$ | Second CMOS inverter |
| INV | Inverter |
| $R_1$–$R_4$ | Risistors |

DESCRIPTION OF PREFERRED EMBODIMENTS

FIG. 1 is a circuit diagram of a first embodiment of a low-voltage output driving circuit in accordance with the invention. Component parts of the circuit diagram of FIG. 1 which are the same as those of FIG. 5 which shows a conventional low-voltage output driving circuit are indicated by the same reference numerals and symbols.

That is, 1 is a logic device. $V_{CC}$ is a power supply voltage of 3.3 V, for instance. $Q_1$–$Q_3$ are npn-type bipolar transistors. $NT_1$–$NT_3$ are NMOS transistors. $PT_1$–$PT_5$ are PMOS transistors. $D_1$–$D_3$ are diodes.

Also, the diodes $D_1$–$D_3$ can be Schottky diodes, for instance.

Figure 5:
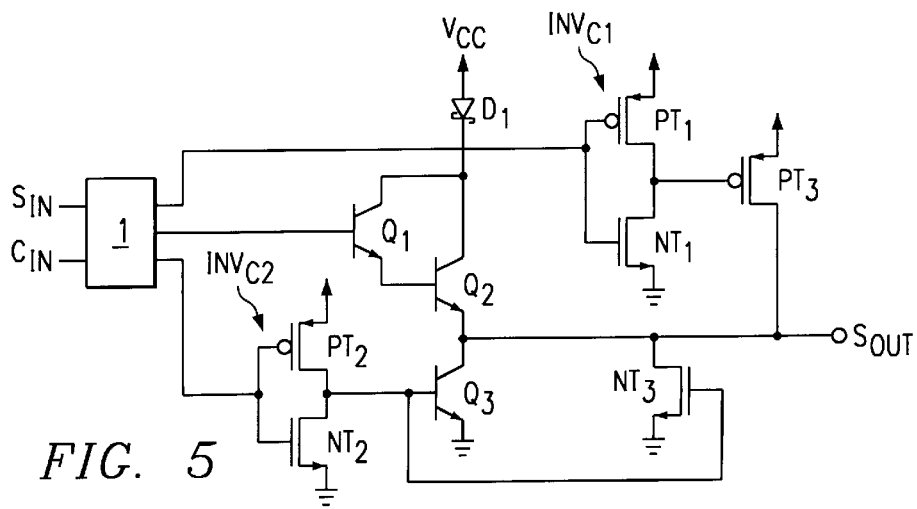
FIG. 5 is a circuit diagram of a conventional low-voltage output driving circuit.

Next, the interconnection between elements of the circuit of FIG. 1 will be described, focusing on the parts different from those of the conventional circuit of FIG. 5, namely, the diodes $D_2$ and $D_3$ and the PMOS transistors $PT_4$ and $PT_5$.

The anode of the diode $D_2$ is connected to the power supply voltage $V_{CC}$, and a cathode is connected to the source of the PMOS transistor $PT_1$ which constitutes the first CMOS invertor $INV_{C1}$.

The anode of the diode $D_3$ is connected to the power supply voltage $V_{CC}$, and a cathode is connected to the gates of the PMOS transistors $PT_1$, $PT_3$, $PT_4$, and $PT_5$ and the source of the PMOS transistor $PT_5$.

The source of the PMOS transistor $PT_4$ for clamping is connected to the node $S_1$ between the output of the first CMOS inverter $INV_{C1}$ and the gate of the PMOS transistor $PT_3$, and the drain is connected to the output line of the signal $S_{OUT}$.

The gate of PMOS transistor $PT_5$ is connected to the power supply voltage $V_{CC}$ and the drain is connected to the output line $S_{OUT}$.

When the input signal $S_{IN}$ is input at a high level, the bipolar transistors $Q_1$ and $Q_2$ become conductive and are maintained in the ON state.

Also, since the NMOS transistor $NT_1$ goes ON, the output of the first CMOS inverter $INV_{C1}$ is brought to ground, the low level, and is supplied to the gate of the PMOS transistor $PT_3$ for active pull-up. Thus, the PMOS transistor $PT_3$ goes ON, and the output line of the signal $S_{OUT}$ is pulled up to the power supply voltage $V_{CC}$.

At that time, in the output of the second CMOS inverter $INV_{C2}$, the NMOS transistor $NT_2$ goes ON, and the level of the base of the bipolar transistor $Q_3$ and the gate of the NMOS transistor $NT_3$ are brought to ground level. Thus, the bipolar transistor $Q_3$ and the NMOS transistor $NT_3$ are maintained in the OFF state.

The emitter voltage of the bipolar transistor $Q_2$ is maintained two base-emitter voltage drops below the power supply voltage $V_{CC}$ of the bipolar transistors $Q_1$ and $Q_2$. However, since the emitter of the bipolar transistor $Q_2$ is connected to the drain of the p-channel MOS transistor $PT_3$, the output signal $S_{OUT}$ is maintained at almost the power supply voltage $V_{CC}$ level, and is output.

When the input signal $S_{IN}$ is input at a low level, the bipolar transistors $Q_1$ and $Q_2$ are maintained in the OFF state, and the output of the first CMOS inverter $INV_{C1}$ goes high. The PMOS transistor $PT_3$ is maintained in the OFF state.

The output of the second CMOS inverter $INV_{C2}$ becomes a high level, and is supplied to the base of the bipolar transistor $Q_3$ and the gate of the NMOS transistor $NT_3$. The bipolar transistor $Q_3$ and the NMOS transistor $NT_3$ are maintained in the ON state.

As both the transistors $Q_3$ and $NT_3$ turn ON, the output signal $S_{OUT}$ is maintained at the ground level and is output.

Also, at the time of three-state logic, the first and second outputs of the logic device 1 are set to a low level, and are supplied to the base of the bipolar transistor $Q_1$ and the input of the first CMOS inverter $INV_{C1}$.

Thus, the bipolar transistors $Q_1$ and $Q_2$ are maintained in the OFF state. Since the output of the first CMOS inverter $INV_{C1}$ goes high and is supplied to the gate of the PMOS transistor $PT_3$, the PMOS transistor $PT_3$ is also maintained in the OFF state.

On the other hand, the third output of the logic device 1 is set to the high level, and is supplied to the input of the second CMOS inverter $INV_{C2}$. Since the output of the second CMOS invertor $INV_{C2}$ becomes a low level and is provided to the base of the bipolar transistor $Q_3$ and the gate of the NMOS transistor $NT_3$, the bipolar transistor $Q_3$ and the NMOS transistor $NT_3$ are maintained in the OFF state.

Therefore, the output line of the signal $S_{OUT}$ is maintained at the high impedance state.

Next, the operation when the output of this low-voltage output driving circuit is higher than the power supply voltage $V_{CC}$ will be explained.

When the output becomes the high impedance state, all of the transistors connected to the output line go OFF, and the node $S_1$ is at a high level which is almost equal to the power supply voltage $V_{CC}$. Here, when the output line is higher than the power supply voltage $V_{CC}$, and when the voltage difference between the output line and the power supply voltage $V_{CC}$ is greater than the threshold voltage of the PMOS transistors $PT_3$, $PT_4$, and $PT_5$, the PMOS transistors $PT_3$, $PT_4$, and $PT_5$ are turned ON. However, as the PMOS transistor $PT_4$ goes ON, since the voltage level of the node $S_1$ is almost equal to the voltage level of the output line, the PMOS transistor $PT_3$ maintains the OFF state.

Therefore, the leakage current which flows from the output line to the power supply voltage $V_{CC}$ via the PMOS transistor $PT_3$ is prevented. At that time, the PMOS transistors $PT_3$, $PT_4$, and $PT_5$, are ON; however the current path between the output line via the PMOS transistors $PT_1$, $PT_4$, and $PT_5$ and the power supply voltage $V_{CC}$ is blocked by the diodes $D_2$ and $D_3$.

Also, since the substrates of the PMOS transistors $PT_4$ and $PT_5$ are connected to the cathode of the diode $D_3$ and the anode is connected to the power supply voltage $V_{CC}$, there is no leakage current via the drain-substrate junction.

As explained previously, according to this embodiment, when the output side is in the high impedance state, equipment with a much higher operating voltage is connected to the output side, and the leakage current from the output side to the power supply voltage $V_{CC}$ to be generated when the output side is higher than the power supply voltage $V_{CC}$ can be suppressed.

Figure 2:
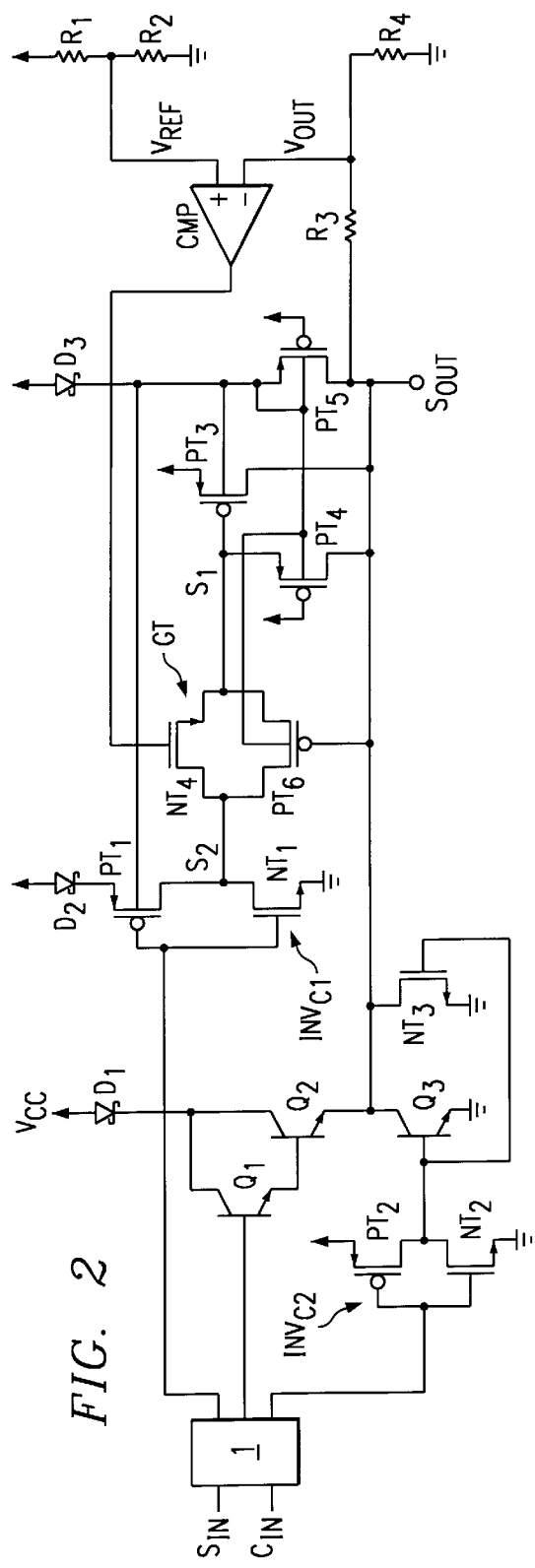
FIG. 2 is a circuit diagram of a second embodiment of the low-voltage output driving circuit of this invention.

FIG. 2 is a circuit diagram of a second embodiment of the low-voltage output driving circuit of the invention.

In the first embodiment of the circuit shown in FIG. 1, when the level of the node $S_1$ at the gate of the transistor $PT_3$ for pulling up is high, the inflow of a leakage current into the power supply voltage $V_{CC}$ can be reliably prevented. However, when the level at node $S_1$ is low, and when the PMOS transistor $PT_3$ pulls up the output line of the signal $S_{OUT}$ the PMOS transistor $PT_4$ turns ON, so that the level of $S_1$ tries to equal the level of the output line. However, since the NMOS transistor $NT_1$ is ON, the level of $S_1$ is not equal to the level of the output line, and the PMOS transistor $PT_3$ does not turn completely OFF. Still, the leakage current flows into the power supply voltage $V_{CC}$ from the output side.

More specifically, in addition to the circuit make-up of FIG. 1, the circuit of FIG. 2 has a transfer gate GT installed between the output $S_2$ of the first CMOS inverter $INV_{C1}$ and the node $S_1$ at the gate of the transistor $PT_3$ for active pull-up. At the same time, the preset reference voltage $V_{REF}$ and the voltage level $V_{OUT}$ which corresponds to the voltage level of the output line of the signal $S_{OUT}$ are compared. When the voltage level $V_{OUT}$ is less than the reference voltage $V_{REF}$, the transfer gate GT is set to the ON state, and the output of the first CMOS inverter $INV_{C1}$ is supplied to the gate of the transistor $PT_3$ for active pull-up. So, when the comparator CMP is installed as a gate control circuit, the voltage level $V_{OUT}$ is less than the reference voltage $V_{REF}$, the transfer gate GT is set to the ON state, which blocks the output of the first CMOS inverter $INV_{C1}$ to the gate of the transistor $PT_3$ for active pull-up.

The transfer gate GT is provided by the NMOS transistor $NT_4$ and the PMOS transistor $PT_6$, in which the sources and drains are connected to each other.

The point of connection of the drain of the NMOS transistor $NT_4$ and the source of the PMOS transistor $PT_6$ is connected to the node $S_2$ between the drain of the PMOS transistor $PT_1$ and the drain of the NMOS transistor $NT_1$, which are the outputs of the first CMOS inverter $INV_{C1}$. The point of connection of the source of the NMOS transistor $NT_4$ and the drain of the PMOS transistor $PT_6$ is connected to the node $S_1$ at the gate of the transistor $PT_3$ for active pull-up.

The gate of the NMOS transistor $NT_4$ is connected to the output of the comparator CMP, and the gate of the PMOS transistor $PT_6$ is connected to the output line of the signal $S_{OUT}$. Also, the substrate of the PMOS transistor $PT_6$ is connected to the cathode of the diode $D_3$.

The reference voltage $V_{REF}$ is set to the level in which the power supply voltage $V_{CC}$ is divided by the resistors $R_1$ and $R_2$ connected in series between the power supply voltage $V_{CC}$ and ground.

The point of connection of the resistors $R_3$ and $R_4$ is connected to the inverting input (+) of the comparator CMP.

The voltage level $V_{OUT}$ is generated as a level in which the voltage of the output line is divided by the resistors $R_3$ and $R_4$ connected in series between the output line of the signal $S_{OUT}$ and ground.

The point of connection of the resistors $R_3$ and $R_4$ is connected to the noninverting input (−) of the comparator CMP.

Figure 3:
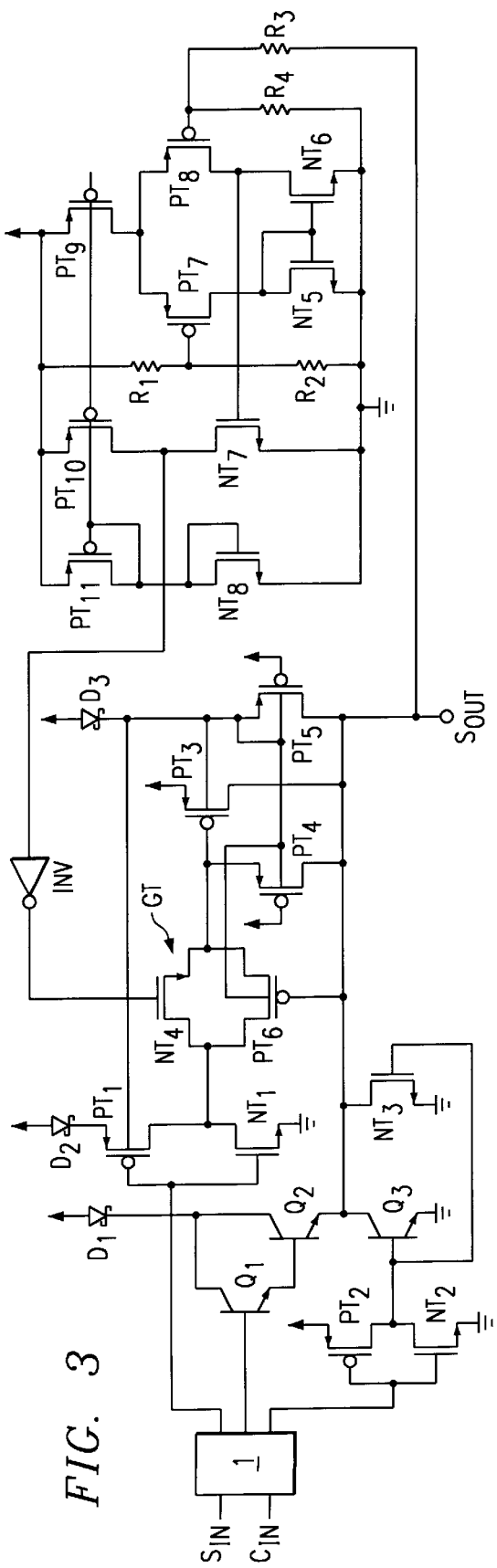
FIG. 3 is a circuit diagram of the same circuit shown in FIG. 2, but showing additional circuit details.

FIG. 3 is a circuit diagram showing the comparator CMP part of the circuit of FIG. 2 as comprising MOS transistors.

In FIG. 3, a constant current source is provided by the NMOS transistor $NT_8$ and the PMOS transistors $PT_9$–$PT_{11}$, and a differential amplifier is provided by the PMOS transistors $PT_7$–$PT_9$ and the NMOS transistors $NT_5$ and $NT_6$. An output stage is provided by the PMOS transistor $PT_{10}$ and the NMOS transistor $NT_7$.

The source of the PMOS transistor $PT_7$ is connected to the source of the PMOS transistor $PT_8$ and the drain of the PMOS transistor $PT_9$, and the gate is connected to the node connecting the resistors $R_1$ and $R_2$. The drain of PMOS transistor $PT_7$ is connected to the drain of the NMOS transistor $NT_5$ and the gates of the NMOS transistors $NT_5$ and $NT_6$.

The gate of the PMOS transistor $PT_8$ is connected to the node connecting the resistors $R_3$ and $R_4$, and the drain is connected to the drain of the NMOS transistor $NT_6$ and the gate of the NMOS transistor $NT_7$.

Also, the source of the NMOS transistor $NT_5$ and the source of the NMOS transistor $NT_6$ are grounded.

The gates of the PMOS transistors $PT_9$–$PT_{11}$ are connected to each other, and each source is connected to the power supply voltage $V_{CC}$.

The drain of the PMOS transistor $PT_{10}$ is connected to the drain of the NMOS transistor $NT_7$, and the point of connection of both are connected to the input of the inverter INV. The output of the inverter INV is connected to the gate of the NMOS transistor $NT_4$ of the transfer gate GT.

The drain of the PMOS transistor $PT_{11}$ is connected to its gate, and at the same time, to the drain and gate of the NMOS transistor $NT_8$.

Also, the sources of the NMOS transistors $NT_7$ and $NT_8$ are grounded.

Referring to the circuit of FIG. 2, at a steady state, the voltage of the output line of the signal $S_{OUT}$ is at a level less than or equal to the power supply voltage $V_{CC}$.

Therefore, the voltage level $V_{OUT}$ to be input into the comparator CMP becomes a level lower than the reference voltage $V_{REF}$. A high-level signal is output from the comparator CMP, and is input to the gate of the NMOS transistor $NT_4$ of the transfer gate GT.

Thus, the NMOS transistor $NT_4$ goes ON. In other words, the transfer gate GT is maintained at the ON state.

In this state, when the input signal $S_{IN}$ is input at a high level, the bipolar transistors $Q_1$ and $Q_2$ go ON.

Also, since the NMOS transistor $NT_1$ goes ON, the output of the first CMOS inverter $INV_{C1}$ is brought to ground, the low level, and is provided to the gate of the PMOS transistor $PT_3$ for active pull-up via the transfer gate GT. Thus, the PMOS transistor $PT_3$ goes ON and the output line of signal $S_{OUT}$ is pulled up to the power supply voltage $V_{CC}$.

At that time, the NMOS transistor $NT_2$ of the second CMOS inverter $INV_{C2}$ goes ON, and the level of the source of the bipolar transistor $Q_3$ and the gate of the NMOS transistor $NT_3$ is brought to ground level. Thus, the bipolar transistor $Q_3$ and the NMOS transistor $NT_3$ are maintained in the OFF state.

The level of the emitter of the bipolar transistor $Q_2$ is maintained at a level in which the voltage drop due to the base-emitter junction of the bipolar transistors $Q_1$ and $Q_2$ is subtracted from the power supply voltage $V_{CC}$. However, since the emitter of the bipolar transistor $Q_2$ is connected to the drain of the p-channel MOS transistor $PT_3$, the output signal $S_{OUT}$ is maintained at the power supply voltage $V_{CC}$ level, and is output.

At that time, since the gate of the PMOS transistor $PT_6$ of the transfer gate GT is maintained at a high level, the PMOS transistor $PT_6$ is maintained in the OFF state.

Here, when the output level is higher than the power supply voltage $V_{CC}$ (3.3 V), for example, 5 V, the power supply voltage $V_{OUT}$ to be input to the comparator CMP is higher than the reference voltage $V_{REF}$. A low-level signal from the comparator CMP is output, and is input to the gate of the NMOS transistor $NT_4$ of the transfer gate GT.

Thus, the NMOS transistor $NT_4$ goes OFF. At that time, since the PMOS transistor $PT_6$ of the transfer gate GT is in the OFF state (since its gate is high), the transfer gate GT is maintained in the OFF state.

In other words, the output signal of the first CMOS inverter $INV_{C1}$ is not transferred to the gate of the transistor $PT_3$ for active pull-up.

On the other hand, in the PMOS transistors $PT_4$ and $PT_5$, when the voltage of the drains is higher than $V_{CC}$ at the gates, it exceeds the threshold voltage, it then turns ON.

Since the PMOS transistor $PT_4$ turns ON, the level of the node $S_1$ at the gate of the PMOS transistor $PT_3$ for active pull-up is almost equal to the output level.

Therefore, a voltage of about 5 V equivalent to the output level is supplied to the gate of the PMOS transistor $PT_3$. For this reason, although the output level is higher than the power supply voltage $V_{CC}$ (3.3 V), for example, 5 V, since the PMOS transistor $PT_3$ maintains the OFF state stably, the inflow of leakage current from the output side to the power supply voltage $V_{CC}$ via the PMOS transistor $PT_3$ is impeded.

At that time, since the source of the PMOS transistor $PT_4$ is connected to the node $S_1$, and since the source of the PMOS transistor $PT_5$ is connected to the cathode of the diode $D_3$, there is no current leakage from the output line to the power supply voltage $V_{CC}$ via the PMOS transistor $PT_4$ or $PT_5$.

Also, since the substrates of the PMOS transistors $PT_4$ and $PT_5$ are connected to the cathode of the diode $D_3$ and the anode is connected to the power supply voltage $V_{CC}$, there is no leakage current via the drain-substrate junction.

At the time of three-state logic (high impedance state), when the level of an output line is about 5 V, which is higher than the power supply voltage, the PMOS transistor $PT_6$ and the NMOS transistor $NT_4$ turn OFF via the high level of an output line and the high-level output of the comparator CMP, and the transfer gate GT turns OFF. Also, since the PMOS transistor $PT_4$ turns ON, the level of the node $S_1$ is equal to the level of an output line, and the PMOS transistor $PT_3$ maintains the OFF state stably. Therefore, there is no leakage of current via the PMOS transistor $PT_3$. Also, the operation of this embodiment (FIG. 2) in this state is similar to that of the first embodiment (FIG. 1).

Also, when the output of the comparator CMP is high, and when the transfer gate GT is in a steady ON state, if the input signal $S_{IN}$ is input as a low level signal, the bipolar transistors $Q_1$ and $Q_2$ are maintained in the OFF state. The output of the first CMOS inverter $INV_{C1}$ goes high, and the PMOS transistor $PT_3$ is maintained in the OFF state.

The output of the second MOS inverter $INV_{C2}$ goes high and is supplied to the base of the bipolar transistor $Q_3$ and the gate of the NMOS transistor $NT_3$. The bipolar transistor $Q_3$ and the NMOS transistor $NT_3$ are maintained in the ON state.

As both the transistors $Q_3$ and $NT_3$ turn ON, the output signal $S_{OUT}$ is maintained at the ground level and is output.

At this time, since the gate of the PMOS transistor $PT_6$ of the transfer gate GT is maintained at the low level, the PMOS transistor $PT_6$ is maintained in the ON state.

For this reason, when only the NMOS transistor $NT_4$ of the transfer gate GT is ON, the signal level to be transferred to the node $S_1$ drops to a level at which the threshold voltage $V_{THN}$ of the NMOS transistor $NT_4$ is subtracted from $V_{CC}$. However, as the PMOS transistor $PT_6$ goes ON, the signal level to be transferred to the node $S_1$ is transferred at the $V_{CC}$ level, and the transistor $PT_3$ for active pull-up is stably maintained in the OFF state.

Figure 4:
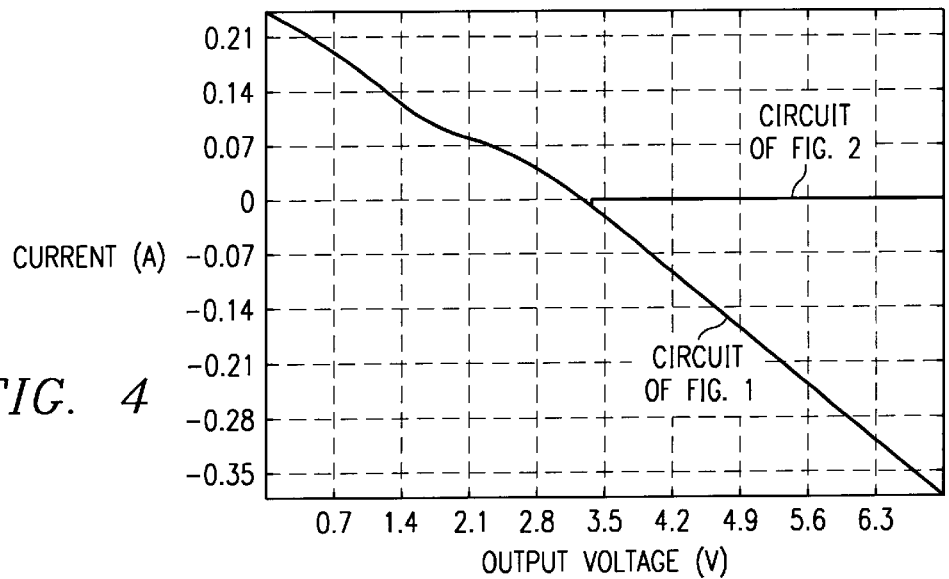
FIG. 4 is a graph which shows the relationship between the voltage at the output side of the circuits of FIGS. 1 and 2 and the leakage current.

FIG. 4 is a graph which shows the relationship between the voltage at the output side of the circuits of FIG. 1 and FIG. 2 and the leakage current of the PMOS transistor $PT_3$ for active pull-up when the bipolar transistors $Q_1$ and $Q_2$ are ON and output a high-level signal (the output of the inverter $INV_{C1}$ is low). In FIG. 4, the abscissa indicates the voltage at the output side, and the ordinate indicates the leakage current.

As seen from FIG. 4, according to the circuit of FIG. 2, when a high-level signal is output, a leakage current in the case where the voltage at the output side exceeds 3.3 V, which is the $V_{CC}$ level, is reduced to "0" A.

As previously described, according to the embodiment of FIG. 2, the transfer gate GT is installed between the output $S_2$ of the first CMOS inverter $INV_{C1}$ and the node $S_1$ at the gate of the transistor $PT_3$ for active pull-up. At the same time, the preset reference voltage $V_{REF}$ and the voltage level $V_{OUT}$ which corresponds to the voltage level of the output line of the signal $S_{OUT}$ are compared. When the voltage $V_{OUT}$ is lower than the reference voltage $V_{REF}$, the transfer gate GT turns ON, and the output of the first CMOS inverter $INV_{C1}$ is supplied to the gate of the transistor $PT_3$ for active pull-up. When the voltage level is higher than the reference voltage $V_{REF}$ since the comparator CMP stops the output of the first CMOS inverter $INV_{C1}$ from reaching the gate of the transistor $PT_3$ for active pull-up, there is the advantage that although the voltage at the output side exceeds the power supply voltage $V_{CC}$, the leakage current which may flow to the voltage source can be reliably prevented.

Also, in the circuit of FIG. 3, the comparator CMP part comprises MOS transistors. However, the comparator CMP could be constructed differently, such as being made of bipolar transistors, for example.

In accordance with the invention, although the input and output of the low-voltage output driving circuit may be in any state, the generation of leakage current which flows toward the power supply from the output side can be reliably prevented.

I claim:

1. A low-voltage output driving circuit comprising:

a buffer stage comprising an input for connection to a control circuit and an output;

a pull-up transistor connected between the output and a power supply voltage source, said pull-up transistor having a control terminal for rendering said pull-up transistor conductive when activated;

a gate circuit having an input and an output, the input of said gate circuit being connected to the control circuit and the output of said gate circuit being connected to the control terminal of said pull-up transistor;

a clamping transistor connected to the output and to the control terminal of said pull-up transistor at a node located in the connection between said gate circuit and said pull-up transistor, said clamping transistor having a control terminal for connection to the power supply voltage source and having respective input and output terminals, the input terminal of said clamping transistor being connected to the node between said gate circuit and the control terminal of said pull-up transistor and the output terminal of said clamping transistor being connected to the output of said buffer stage;

said clamping transistor when conductive maintaining the control terminal of said pull-up transistor at the output level of said buffer stage when the output level is higher than the level of the power supply voltage; and a gate control circuit operably regulating said gate circuit for rendering said gate circuit conductive when the output level from said buffer stage is lower than the power supply voltage level and for rendering said gate circuit non-conductive when the output level of said buffer stage is higher than the power supply voltage level.

2. A driving circuit as set forth in claim 1, wherein said gate control circuit includes a transfer gate connected between the output of said gate circuit and said node at the control terminal of said pull-up transistor, said transfer gate having an input and an output, and a comparator connected to the input of said transfer gate, said comparator having first and second inputs for respectively receiving a reference voltage and the output voltage from the output of said buffer stage;

said comparator producing an output signal turning on said transfer gate when the voltage level corresponding to the voltage of the output line is less than the reference voltage, thereby enabling the output of said gate circuit to be provided to the control terminal of said pull-up transistor.

3. A driving circuit as set forth in claim 2, wherein said gate circuit comprises an inverter defined by a pair of serially connected CMOS transistors having their respective control terminals connected together; and the control circuit being connected to a second node in the connection between the control terminals of said pair of CMOS transistors defining said inverter.

4. A driving circuit as set forth in claim 3, further including a second inverter defined by a second pair of serially connected CMOS transistors having their respective control terminals connected together;

said control circuit being connected to a third node interposed in the connection between the control terminals of said CMOS transistors included in said second inverter; and a further bipolar transistor and an MOS transistor connected in parallel to the output of said buffer stage and to ground, each of said further bipolar transistor and said MOS transistor having a control terminal;

the output of said second inverter being connected to the control terminals of said further bipolar transistor and said MOS transistor for controlling the conductivity thereof.

5. A driving circuit as set forth in claim 4, further including a companion transistor having a control terminal and connected between the power supply voltage source and the output of said buffer stage and having a control terminal connected to the control terminal of said clamping transistor;

a first blocking diode interconnected between the power supply voltage source and said first inverter; and a second blocking diode interconnected between the power supply voltage source and said companion transistor;

said first and second diodes blocking the current path between the output of said buffer stage and the power supply voltage source via the first inverter, the clamping transistor, and the companion transistor.

6. A low-voltage output driving circuit comprising:

a buffer stage comprising an input for connection to a control circuit and an output;

a pull-up transistor connected between the output and a power supply voltage source, said pull-up transistor having a control terminal for rendering said pull-up transistor conductive when activated;

a gate circuit having an input and an output, the input of said gate circuit being connected to the control circuit and the output of said gate circuit being connected to the control terminal of said pull-up transistor; and a clamping transistor connected to the output and to the control terminal of said pull-up transistor at a node located in the connection between said gate circuit and said pull-up transistor, said clamping transistor having a control terminal for connection to the power supply voltage source and having respective input and output terminals, the input terminal of said clamping transistor being connected to the node between said gate circuit and the control terminal of said pull-up transistor and the output terminal of said clamping transistor being connected to the output of said buffer stage;

said clamping transistor when conductive maintaining the control terminal of said pull-up transistor at the output level of said buffer stage when the output level is higher than the level of the power supply voltage.

7. A driving circuit as set forth in claim 6, wherein said gate circuit comprises an inverter defined by a pair of serially connected CMOS transistors having their respective control terminals connected together; and the control circuit being connected to a second node in the connection between the control terminals of said pair of CMOS transistors defining said inverter.

8. A driving circuit as set forth in claim 7, further including a second inverter defined by a second pair of serially connected CMOS transistors having their respective control terminals connected together;

said control circuit being connected to a third node interposed in the connection between the control terminals of said CMOS transistors included in said second inverter; and a further bipolar transistor and an MOS transistor connected in parallel to the output of said buffer stage and to ground, each of said further bipolar transistor and said MOS transistor having a control terminal;

the output of said second inverter being connected to the control terminals of said further bipolar transistor and said MOS transistor for controlling the conductivity thereof.

9. A driving circuit as set forth in claim 8, further including a companion transistor having a control terminal and connected between the power supply voltage source and the output of said buffer stage and having a control terminal connected to the control terminal of said clamping transistor;

a first blocking diode interconnected between the power supply voltage source and said first inverter; and a second blocking diode interconnected between the power supply voltage source and said companion transistor;

said first and second diodes blocking the current path between the output of said buffer stage and the power supply voltage source via the first inverter, the clamping transistor, and the companion transistor.

* * * * *